(12) United States Patent
Grape et al.

(10) Patent No.: US 11,824,510 B2
(45) Date of Patent: Nov. 21, 2023

(54) BALUN

(71) Applicant: Winchester Interconnect Corporation, Norwalk, CT (US)

(72) Inventors: Richard Harold Grape, Worcester, MA (US); Jose Miguel Vega Haro, Sonora (MX)

(73) Assignee: WINCHESTER INTERCONNECT CORPORATION, Norwalk, CT (US)

( * ) Notice: Subject to any disclaimer, the term of this patent is extended or adjusted under 35 U.S.C. 154(b) by 112 days.

(21) Appl. No.: 17/496,367

(22) Filed: Oct. 7, 2021

(65) Prior Publication Data

US 2022/0224304 A1 Jul. 14, 2022

Related U.S. Application Data

(60) Provisional application No. 63/136,715, filed on Jan. 13, 2021.

(51) Int. Cl.
*H03H 7/42* (2006.01)
*H03H 3/007* (2006.01)

(52) U.S. Cl.
CPC .............. *H03H 7/42* (2013.01); *H03H 3/007* (2013.01)

(58) Field of Classification Search
CPC ................. H03H 7/42; H03H 3/007
USPC .......................................... 333/25
See application file for complete search history.

(56) References Cited

U.S. PATENT DOCUMENTS

| | | |
|---|---|---|
| 2014/0338739 A1 | 11/2014 | Liu et al. |
| 2015/0200645 A1 | 7/2015 | Waks et al. |
| 2016/0136889 A1 | 5/2016 | Rolland et al. |
| 2022/0111582 A1* | 4/2022 | Zhang .................. G03F 7/0037 |

OTHER PUBLICATIONS

International Search Report and Written Opinion issued in International Application No. PCT/US/11242 dated Mar. 30, 2022 (11 pages).
Mitchell, D., "Examination of Additively Manufactured Chokes for Size Reduction and Performance Improvement in RF and Microwave Applications", Master of Science Thesis, Norman, Oklahoma (2018) (14 pages).

\* cited by examiner

*Primary Examiner* — Rakesh B Patel
(74) *Attorney, Agent, or Firm* — Rothwell, Figg, Ernst & Manbeck, P.C.

(57) ABSTRACT

A balun comprising a three-dimensional (3D) printed base. In one embodiment the balun further comprises a piece of copper tape adhered to an outer surface of the 3D printed base.

13 Claims, 4 Drawing Sheets

BALUN

CROSS-REFERENCE TO RELATED APPLICATION

This application claims the benefit of U.S. provisional patent application No. 63/136,715, filed on Jan. 13, 2021, which is incorporated by this reference.

TECHNICAL FIELD

This disclosure relates to baluns.

BACKGROUND

In certain applications, baluns are tuned to a frequency of −16 db or less and are place around a coil cable to reduce shield currents.

SUMMARY

Certain challenges presently exist. For instance, currently, baluns are constructed using a Teflon base. This Teflon base is porous and over time can warp. The machining process of the Teflon is a two-step process and is time consuming and costly. The baluns are also plated with a copper plating. Ideally, the copper plating process should produce a consistent thickness of copper over the surface of the Teflon base. However, the plating is hard to hold to the current dimensional requirement and many failures occur. Accordingly, this disclosure describes an improved balun design.

For example, in one aspect there is provided a balun comprising a three-dimensional (3D) printed base (e.g., the base may have been printed using a resin-based printing process such as the Digital Light Synthesis (DLS) printing process). In some embodiments, the balun further comprises a piece of electrically conducting tape (e.g., copper tape) adhered to an outer surface of the 3D printed base. In some embodiments, the balun further comprises a capacitor directly connected to the electrically conducting tape.

In another aspect there is provided a method for making a balun. In one embodiment, the method includes: using a three-dimensional (3D), resin-based printer to print a 3D base; attaching an electrically conducting tape to an outer surface of the 3D base; and connecting a capacitor to the copper tape. In some embodiments, the 3D resin-based printer uses a Digital Light Synthesis (DLS) printing process to print the 3D base. In some embodiments, attaching the tape to the outer surface of the 3D base comprises using an adhesive to adhere the tape to the outer surface.

DETAILED DESCRIPTION

In one embodiment, the Teflon base is replaced with a 3D printed base; for example a 3D printed base obtained using a resin-based printing process that cures liquid plastic resin into a solid part using light (e.g., ultraviolet (UV) light). In one embodiment, the resin-based 3D printing process works by projecting light through an oxygen-permeable window into a reservoir of UV-curable resin. One such resin-based printing process is known as the Digital Light Synthesis (DLS) printing process. The DLS printing process uses digital light projection, oxygen permeable optics, and liquid resins to produce desired 3D products. A printer for producing a DLS 3D printed balun base may be obtained from Carbon® (see, e.g., www.carbon3d.com).

Figure 1A:
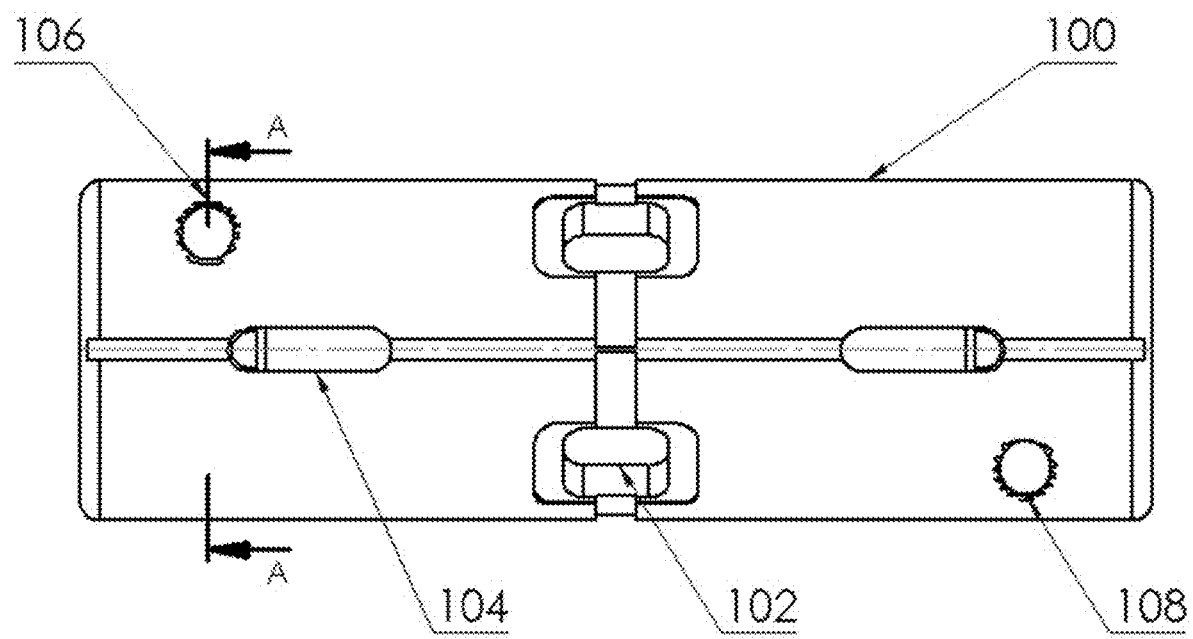
FIG. 1A illustrates a balun base according to an embodiment.
Figure 1B:
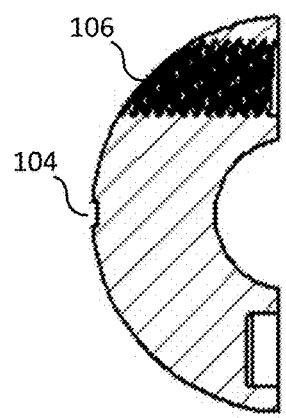
FIG. 1B illustrates a cross-sectional view of the balun base shown in FIG. 1A.

For the 3D process, one can 3D print all the features in the balun base eliminating the need for the two-step machining process. FIG. 1A illustrates an example DLS 3D printed balun base 100, and FIG. 1B is a cross-sectional view of the base 100 along axis A. As shown in FIGS. 1A and 1B, the DLS printed base 100 can be printed with all the necessary pockets (e.g., pocket 102), grooves (e.g. groove 104), and thread holes (e.g., holes 106 and 108). By printing the base 100 with all of the necessary features (e.g., pockets, grooves, thread holes), this eliminates the machining process, which is a large advantage over using a Teflon base as the Teflon baes requires a two stage machining process. The printed base 100 is very accurate and one can adjust any dimension to nominal. Additionally, no additional steps are required for a finished base balun. Also, the base 100 has been tested and passed Proton Emissions Testing.

Figure 2:
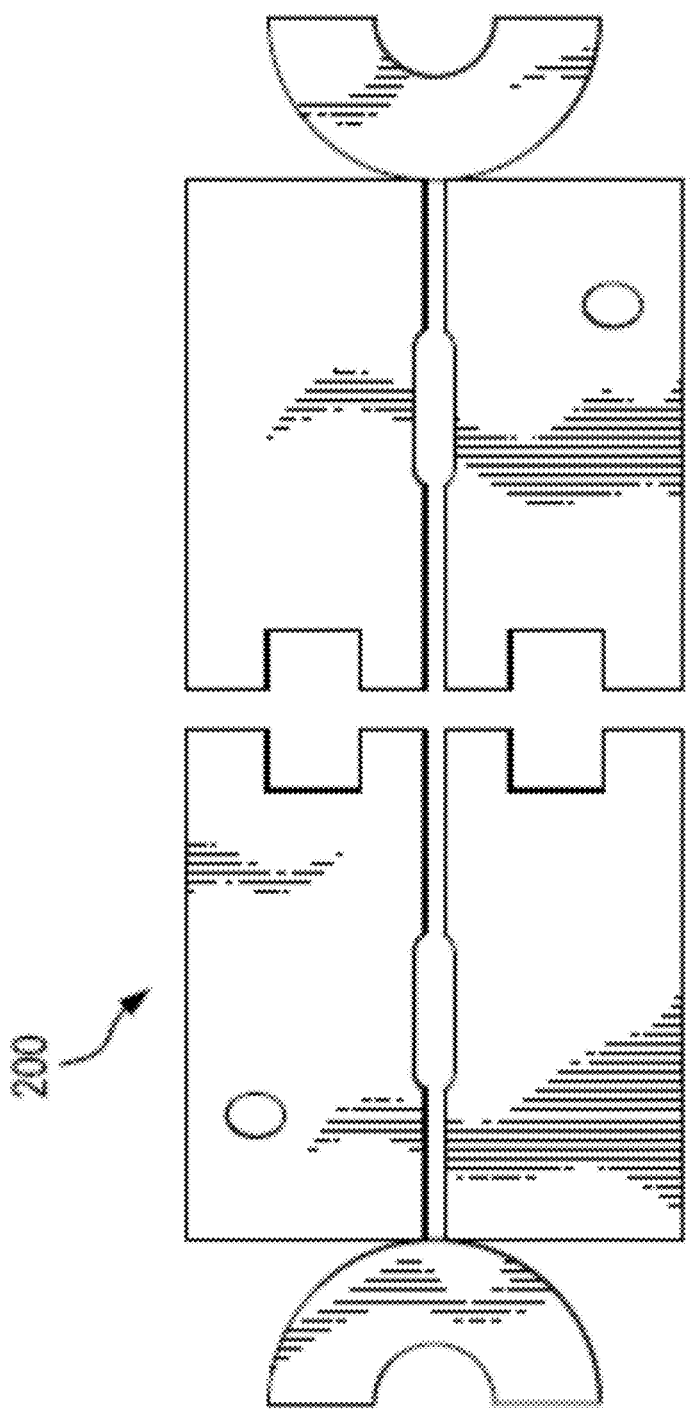
FIG. 2 illustrates a piece of copper tape after it has been die stamped.
Figure 3:
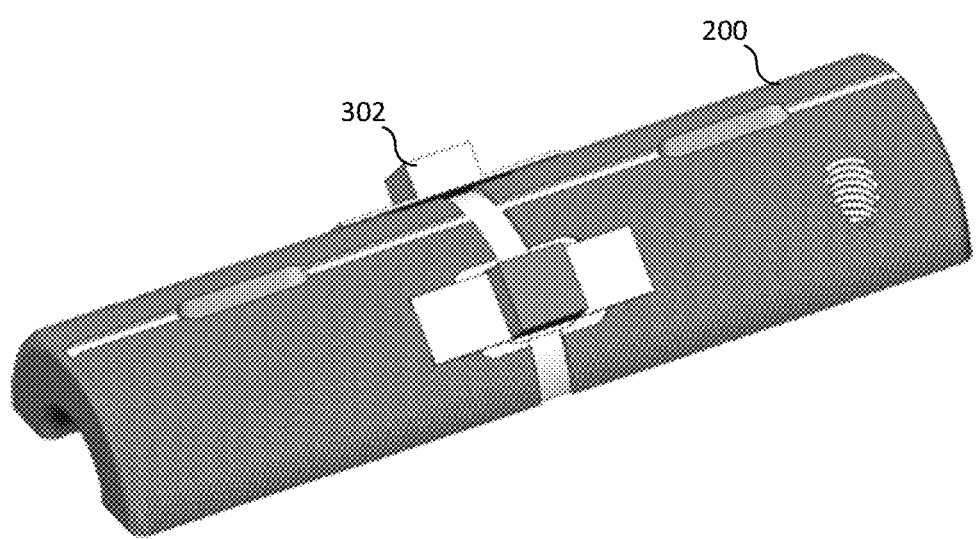
FIG. 3 illustrates a balun base after copper tape has been applied to the outer surface of the base.

Additionally, the copper plating process is replaced by using a copper tape, thereby eliminating the inconsistent plating thickness issue. In one embodiment, the copper tape that is used is the EMI Copper Foil Shielding Tape made by 3M (UPC 05400727470). FIG. 2 illustrates a piece of copper tape 200 after it has been die stamped to remove portions of the tape corresponding to the packet(s), groove(s), and thread hole(s) formed on the surface of base 100. This piece of copper tape, which has copper on one side and an adhesive on the opposite side is adhered to the base 100, as shown in FIG. 3 which illustrates the balun base after the copper tape has been applied to the outer surface of the base. An advantage of using copper tape is that the thickness of the copper layer is consistent, thereby reducing scrap and providing a consistent tuning result. After the copper tape is applied, one or more capacitors are directly connected (e.g., soldered) to the copper tape. FIG. 3 further illustrates a capacitor 302 that has been electrically and physically connected to the copper tape 200.

Figure 4:
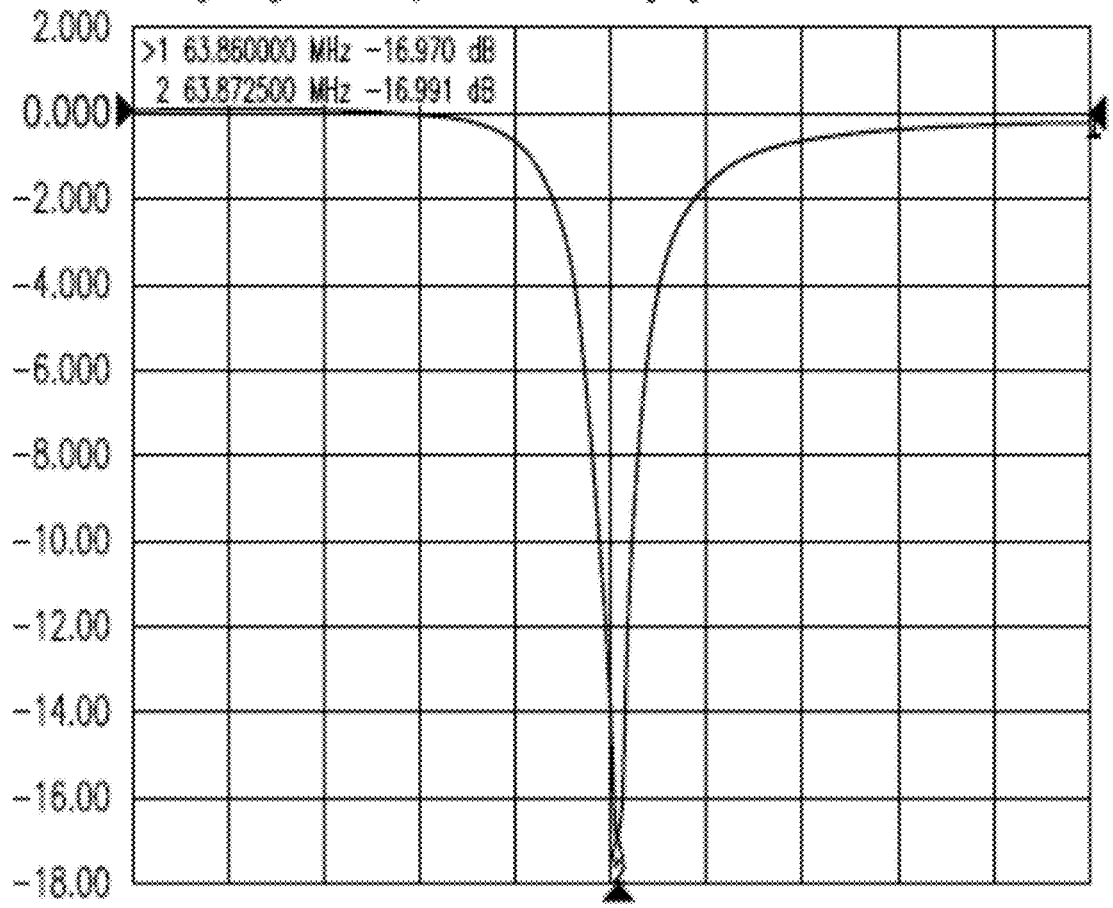
FIG. 4 illustrates the performance of a balun according to an embodiment.

These design changes described above has produced a balun with better test results than the current Teflon balun. The testing average of the Teflon balun is −16 db, the new DLS 3D printed design is yielding on average −17 db (see FIG. 4).

While various embodiments are described herein, it should be understood that they have been presented by way of example only, and not limitation. Thus, the breadth and scope of this disclosure should not be limited by any of the above-described exemplary embodiments. Moreover, any combination of the above-described elements in all possible variations thereof is encompassed by the disclosure unless otherwise indicated herein or otherwise clearly contradicted by context.

Additionally, while the processes described above and illustrated in the drawings are illustrated as a sequence of steps, this was done solely for the sake of illustration. Accordingly, it is contemplated that some steps may be added, some steps may be omitted, the order of the steps may be re-arranged, and some steps may be performed in parallel.

The invention claimed is:

1. A balun, the balun comprising:
   a three-dimensional (3D) printed base;
   a first piece of electrically conducting tape adhered to a first portion of an outer surface of the 3D printed base; and
   a first capacitor, wherein a first terminal of the first capacitor is directly adhered to the first piece of electrically conducting tape.

2. The balun of claim 1, further comprising:
   a second piece of electrically conducting tape adhered to a second portion of the outer surface of the 3D printed base, wherein
   a second terminal of the first capacitor is attached directly to the second piece of electrically conducting tape.

3. The balun of claim 2, further comprising:
   a third piece of electrically conducting tape adhered to a third portion of the outer surface of the 3D printed base;
   a fourth piece of electrically conducting tape adhered to a fourth portion of the outer surface of the 3D printed base; and
   a second capacitor, wherein
   a first terminal of the second capacitor is attached to the third piece of electrically conducting tape, and
   a second terminal of the second capacitor is attached to the fourth piece of electrically conducting tape.

4. The balun of claim 1, further comprising producing the 3D printed base using a resin-based printing process.

5. The balun of claim 4, wherein the resin-based printing process is a Digital Light Synthesis (DLS) printing process.

6. The balun of claim 1, wherein the first piece of electrically conducting tape is a first piece of copper tape.

7. A method for making a balun, the method comprising:
   using a three-dimensional (3D), resin-based printer to print a 3D base;
   adhering a first piece of electrically conducting tape to a first portion of an outer surface of the 3D base; and
   attaching a first terminal of a capacitor directly to the first piece of electrically conducting tape.

8. The method of claim 7, wherein the 3D resin-based printer uses a Digital Light Synthesis (DLS) printing process to print the 3D base.

9. The method of claim 7, wherein the first piece of electrically conducting tape is a first die stamped piece of copper tape.

10. The method of claim 9, wherein attaching the first die stamped piece of copper tape to the outer surface of the 3D base comprises using an adhesive to adhere the first die stamped piece of copper tape to the outer surface.

11. The method of claim 7, further comprising:
    adhering a second piece of electrically conducing tape to a second portion of the outer surface of the 3D base; and
    attaching a second terminal of the first capacitor to the second piece of the electrically conducting tape.

12. The method of claim 11, further comprising:
    adhering a third piece of electrically conducing tape to a third portion of the outer surface of the 3D base; and
    adhering a fourth piece of electrically conducing tape to a fourth portion of the outer surface of the 3D base.

13. The method of claim 12, further comprising:
    attaching a first terminal of a second capacitor to the third piece of electrically conducting tape; and
    attaching a second terminal of the second capacitor to the fourth piece of electrically conducting tape.

* * * * *